（12）United States Patent
Niboshi

(10) Patent No.: US 12,120,909 B2
(45) Date of Patent: Oct. 15, 2024

(54) DISPLAY DEVICE

(71) Applicant: SHARP KABUSHIKI KAISHA, Sakai (JP)

(72) Inventor: Manabu Niboshi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 415 days.

(21) Appl. No.: 17/440,757

(22) PCT Filed: Mar. 29, 2019

(86) PCT No.: PCT/JP2019/014098
§ 371 (c)(1),
(2) Date: Sep. 17, 2021

(87) PCT Pub. No.: WO2020/202284
PCT Pub. Date: Oct. 8, 2020

(65) Prior Publication Data
US 2022/0181591 A1   Jun. 9, 2022

(51) Int. Cl.
*H10K 50/86*   (2023.01)
*H10K 50/818*   (2023.01)
(Continued)

(52) U.S. Cl.
CPC ......... *H10K 50/865* (2023.02); *H10K 50/818* (2023.02); *H10K 59/35* (2023.02);
(Continued)

(58) Field of Classification Search
CPC ....... H10K 50/828; H05B 33/26; H05B 33/28
See application file for complete search history.

(56) References Cited

U.S. PATENT DOCUMENTS

2009/0302757 A1* 12/2009 Arai ................. H10K 59/80518
313/505
2010/0072884 A1* 3/2010 Tchakarov ........ B32B 17/10174
445/35
(Continued)

FOREIGN PATENT DOCUMENTS

JP   2004-226842 A   8/2004
JP   2009-295538 A   12/2009
(Continued)

OTHER PUBLICATIONS

Banerjee et. al. "Characterisation of amorphous molybdenum silicide (MoSi) superconducting thin films and nanowires" (2017) Supercond. Sci. Technol. 30 084010 (Year: 2017).*
(Continued)

*Primary Examiner* — Joseph C. Nicely
*Assistant Examiner* — Alvin L Lee
(74) *Attorney, Agent, or Firm* — ScienBiziP, P.C.

(57) ABSTRACT

A display device includes a light-emitting element layer including a plurality of light-emitting elements in each of which a first electrode, a function layer including a light-emitting layer, and a second electrode are disposed in this order from a thin film transistor layer side, and the first electrode includes a first transparent electrode, a reflective metal layer, and a semi-transparent metal layer in this order from the side opposite to the light-emitting layer.

20 Claims, 10 Drawing Sheets

(51) Int. Cl.
*H10K 50/828* (2023.01)
*H10K 59/123* (2023.01)
*H10K 59/35* (2023.01)
*H10K 102/00* (2023.01)

(52) U.S. Cl.
CPC ......... *H10K 50/828* (2023.02); *H10K 59/123* (2023.02); *H10K 2102/351* (2023.02)

(56) References Cited

U.S. PATENT DOCUMENTS

| | | | |
|---|---|---|---|
| 2013/0105776 A1* | 5/2013 | Ishizuya | H10K 50/852 257/40 |
| 2013/0194477 A1* | 8/2013 | Ito | H10K 50/828 399/221 |
| 2014/0284575 A1* | 9/2014 | Sugisawa | H10K 59/876 257/40 |
| 2015/0162385 A1* | 6/2015 | Dittmar | H10K 71/00 438/22 |
| 2016/0380227 A1* | 12/2016 | Kojima | H10K 50/82 257/40 |
| 2018/0212184 A1* | 7/2018 | Kondo | H10K 50/844 |

FOREIGN PATENT DOCUMENTS

| | | |
|---|---|---|
| JP | 2010-061951 A | 3/2010 |
| JP | 2013-157278 A | 8/2013 |
| JP | 2018-170126 A | 11/2018 |
| WO | WO-2018181573 A1 * 10/2018 ......... H01L 51/5203 |

OTHER PUBLICATIONS

Moerland et. al. "Subnanometer-accuracy optical distance ruler based on fluorescence quenching by transparent conductors, Supplement 1" Optica 3, 112-117 (2016) (Year: 2016).*

Greiner, M., Lu, ZH. "Thin-film metal oxides in organic semiconductor devices: their electronic structures, work functions and interfaces." NPG Asia Mater 5, e55 (2013). (Year: 2013).*

Robert J. Moerland and Jacob P. Hoogenboom, "Subnanometer-accuracy optical distance ruler based on fluorescence quenching by transparent conductors," Supplemental, Optica 3, 112-117 (2016) (Year: 2016).*

Mallem et. al. "Molybdenum oxide: A superior hole extraction layer for replacing p-type hydrogenated amorphous silicon with high efficiency heterojunction Si solar cells," Materials Research Bulletin, vol. 110, 2019, pp. 90-96 (Year: 2019).*

* cited by examiner

DISPLAY DEVICE

TECHNICAL FIELD

The disclosure relates to a display device that can suppress external light reflection without using a circular polarizer.

BACKGROUND ART

A display device such as a top-emitting organic EL (electroluminescence) display device includes a metallic reflective layer made of, for example, highly reflective metal such as silver on the lower layer side of a light-emitting layer. Accordingly, such a display device has high external light reflectivity, and has problems such that when used at a location near a window or outdoors, the light emitted directly from the light-emitting layer interferes with the light reflected inside the display device and then emitted therefrom, which results in reduction in contrast and occurrence of coloring when viewed in an oblique direction.

Therefore, in a display device such as a known organic EL display device, in order to suppress external light reflection, a circular polarizer is generally adhered to a display surface. For example, Patent Document 1 describes that by providing an elliptical polarizer capable of compensating a broadband wavelength range in visible light, external light reflection in the broadband wavelength range can be prevented in a metal electrode mounted in an organic EL device or the like.

CITATION LIST

Patent Literature

PTL 1: JP 2004-226842 A

SUMMARY

Technical Problem

However, the circular polarizer significantly reduces light emission intensity. In addition, the elliptical polarizer capable of compensating the broadband wavelength range in visible light as just described is relatively expensive, which leads to increase in manufacturing unit price of the display device.

The disclosure is made in view of the aforementioned problems, and an object thereof is to provide a display device that can suppress external light reflection without using a circular polarizer.

Solution to Problem

A display device according to an aspect of the disclosure includes: a thin film transistor layer including thin-film transistors; a light-emitting element layer including a plurality of light-emitting elements in each of which a first electrode, a function layer including a light-emitting layer, and a second electrode are disposed on the thin film transistor layer in this order from a side of the thin film transistor layer; and a sealing layer covering the light-emitting element layer. The first electrode includes a first transparent electrode, a reflective metal layer, and a semi-transparent metal layer in this order on the thin film transistor layer.

Advantageous Effects of Disclosure

According to one aspect of the disclosure, by absorbing light in the semi-transparent metal layer, reflectivity can be suppressed; therefore, a known circular polarizer used to suppress the reflectivity is not required. Consequently, according to an aspect of the disclosure, a display device capable of suppressing external light reflection without using a circular polarizer can be provided.

DESCRIPTION OF EMBODIMENTS

First Embodiment

Figure 2:
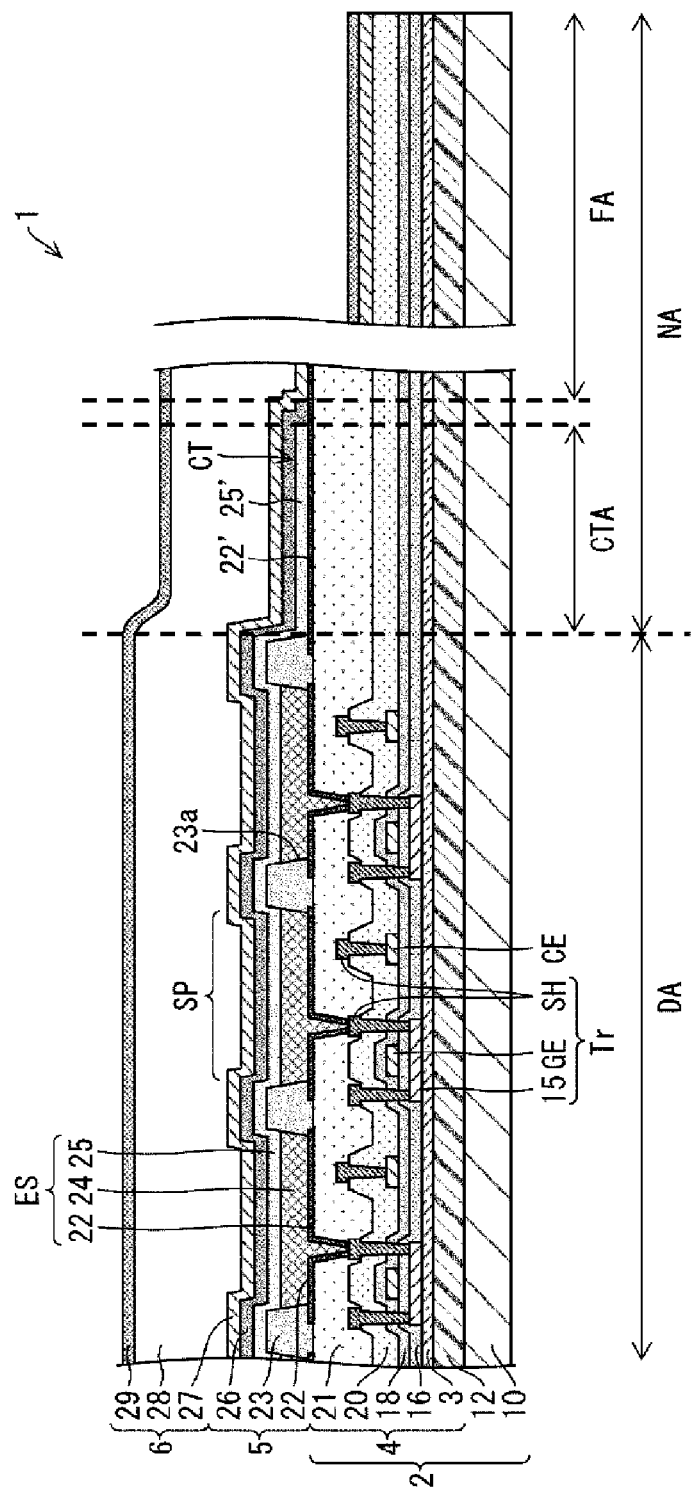
FIG. 2 is a cross-sectional view illustrating a schematic configuration of a main portion of the display device according to the first embodiment.

FIG. 2 is a cross-sectional view illustrating a schematic configuration of a main portion of a display device 1 according to the present embodiment.

As illustrated in FIG. 2, the display device 1 according to the present embodiment is a self-luminous display device including a configuration in which a light-emitting element layer 5 is disposed on a support body 2. The light-emitting element layer 5 is covered by a sealing layer 6. Hereinafter, the sealing layer 6 side will be referred to as the upper side (upper layer side), and the support body 2 side will be referred to as the lower side (lower layer side).

Note that in the present embodiment, a case is described as an example in which the support body 2 is an active matrix substrate including a configuration described below. However, as long as the support body 2 is an array substrate provided with an active element such as a thin film transistor (TFT), the support body 2 is not particularly limited.

The support body 2 illustrated in FIG. 2 includes, in the order from the lower layer side, a lower face film 10, a resin layer 12, a barrier layer 3 (base coat film), and a thin film transistor layer 4 (drive element layer).

The light-emitting element layer 5 is disposed on the thin film transistor layer 4. The light-emitting element layer 5 includes a plurality of light-emitting elements ES. The thin film transistor layer 4 includes a plurality of thin film transistors Tr (TFTs) that drive the light-emitting elements ES. Details are described below.

The lower face film 10 is a film that is bonded to a lower face of the resin layer 12 after a support substrate such as mother glass is peeled and thus realizes a display device having excellent flexibility. A plastic film formed of, for example, resin having flexibility, such as polyethylene terephthalate, polyimide, polycarbonate, or aramid is used as the lower face film 10. Note that a solid substrate such as a glass substrate may be used instead of the lower face film 10 and the resin layer 12. Examples of materials of the resin layer 12 include polyimide, epoxy resin, polyamide, and the like. The barrier layer 3 is a layer that prevents foreign matters such as water and oxygen from entering the thin film transistor layer 4 and the light-emitting element layer 5. The barrier layer 3 can be formed of a silicon oxide film, a silicon nitride film, or a silicon oxynitride film, or a layered film of these films.

A subpixel circuit that controls each of the light-emitting elements ES in the light-emitting element layer 5 is formed in the thin film transistor layer 4. The thin film transistor layer 4 includes a semiconductor film 15, an inorganic insulating film 16, a first metal layer including a gate electrode GE, an inorganic insulating film 18, a second metal layer including a capacitance wiring line CE, an inorganic insulating film 20, a third metal layer including a source-drain wiring line SH, and an interlayer insulating film 21 (flattening film). These layers are disposed in this order from the lower layer side.

The display device 1 includes a display region DA and a frame region NA around the display region DA. The plurality of thin film transistors Tr including the semiconductor film 15, the inorganic insulating film 16, the gate electrode GE, the inorganic insulating film 18, the inorganic insulating film 20, and the source-drain wiring line SH are formed in a region corresponding to the display region DA in the thin film transistor layer 4. Further, a plurality of capacitance elements including a capacitance electrode (not illustrated) included in the capacitance wiring line CE formed directly on the inorganic insulating film 18, the inorganic insulating film 18, and a capacitance counter electrode (not illustrated) formed directly below the inorganic insulating film 18 and formed overlapping the capacitance electrode in the same layer as the first metal layer that forms the gate electrode GE are formed in the region corresponding to the display region DA in the thin film transistor layer 4.

The semiconductor film 15 is formed of low-temperature polysilicon (LTPS) or an oxide semiconductor (for example, an In—Ga—Zn—O based semiconductor), for example. Note that the transistor having a top gate structure is illustrated in FIG. 2 but may have a bottom gate structure. Each of the first metal layer, the second metal layer, and the third metal layer is formed of a single layer film or a layered film of metal including, for example, at least one of aluminum, tungsten, molybdenum, tantalum, chromium, titanium, and copper. Each of the inorganic insulating films 16, 18, and 20 can be formed of, for example, a silicon oxide (SiOx) film or a silicon nitride (SiNx) film, or a layered film of these, formed by using a CVD method. The interlayer insulating film 21 can be formed of, for example, a coatable organic material such as polyimide or acrylic.

The light-emitting element layer 5 includes a first electrode 22, a bank 23, a function layer 24, a second electrode 25, and a cap layer 26 in the order from the lower layer side (that is, the thin film transistor layer 4 side). One and the other of the first electrode 22 and the second electrode 25 are an anode electrode and a cathode electrode. Hereinafter, a case in which the first electrode 22 is an anode electrode and the second electrode 25 is a cathode electrode is described as an example. In the example illustrated in FIG. 2, the first electrode 22 is a pattern electrode (pattern anode electrode) that is patterned in an island shape for each subpixel SP, and the second electrode 25 is a common electrode (common cathode electrode) disposed in common to each subpixel SP.

The light-emitting element ES includes the first electrode 22, the function layer 24, the second electrode 25, and the cap layer 26. In the present embodiment, the layers constituting the light-emitting element ES between the first electrode 22 and the second electrode 25 are collectively referred to as the function layer 24. Note that the layered structure of the light-emitting element ES will be described in more detail below. The plurality of light-emitting elements ES are disposed in a region corresponding to the display region DA in the light-emitting element layer 5. The light-emitting element ES is formed for each subpixel SP, corresponding to a subpixel of each color. The display device 1 includes, as the light-emitting elements ES, a light-emitting element ESR having a luminescent color of red (R), a light-emitting element ESG having a luminescent color of green (G), and a light-emitting element ESB having a luminescent color of blue (B). The light-emitting element ES of any one of the light-emitting elements ES is disposed in each subpixel SP. The bank 23 functions as an edge cover covering each edge of the first electrode 22, and functions as a subpixel separation film partitioning each subpixel SP. An opening 23a is disposed in the bank 23 for each subpixel SP. An exposed portion via the opening 23a of the first electrode 22 forms a light-emitting region of each subpixel SP. The bank 23 is formed by applying, for example, an organic material of insulation such as polyimide or acrylic and subsequently patterning the organic material by photolithography.

In addition, in the light-emitting element layer 5, a lead section 22' formed in the same layer as the first electrode 22 is formed straddling the display region DA and the frame region NA.

The second electrode 25 is formed on the entire surface of the display region DA. An extending section 25' of the second electrode 25 is formed in the frame region NA. The cap layer 26 is formed covering the second electrode 25 and the extending section 25' of the second electrode 25. The cap layer 26 covers the second electrode 25 formed on the entire surface of the display region DA and thus is formed covering the entire surface of the display region DA. The frame region NA includes a contact region CTA in which the lead section 22' and the extending section 25' of the second electrode 25 form a contact portion CT, and a sealing region FA outside an end portion of the cap layer 26.

The sealing layer 6 has transparency and includes, for example, a first inorganic sealing film 27, an organic sealing film 28, and a second inorganic sealing film 29 in the order from the lower layer side (that is, the light-emitting element layer 5 side). However, the sealing layer 6 is not limited thereto and may be formed of a single layer of an inorganic sealing film or a layered body of five or more layers of an organic sealing film and an inorganic sealing film. The light-emitting element ES is sealed by the sealing layer 6, and thereby water, oxygen, or the like can be prevented from permeating into the light-emitting element ES.

Each of the first inorganic sealing film 27 and the second inorganic sealing film 29 can be formed of, for example, a silicon oxide film, a silicon nitride film, or a silicon oxynitride film formed by CVD or of a layered film of these films. The organic sealing film 28 is a transparent organic film thicker than the first inorganic sealing film 27 and the second inorganic sealing film 29, and can be formed of, for example, coatable photosensitive resin such as polyimide resin or acrylic resin.

Next, the layered structure of the light-emitting element ES will be described more in detail with reference to FIG. 1.

Figure 1:
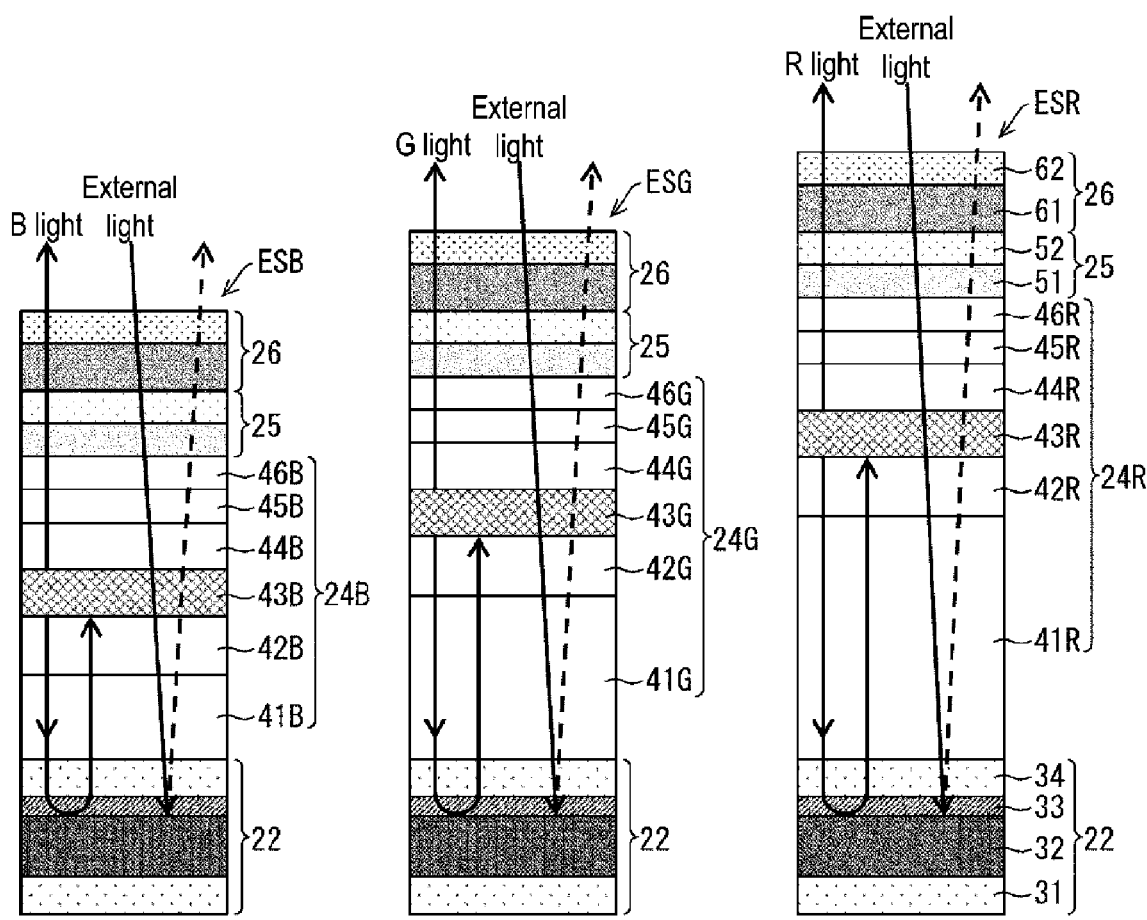
FIG. 1 is a cross-sectional view illustrating a schematic configuration of each of light-emitting elements in a light-emitting element layer of a display device according to a first embodiment.

FIG. 1 is a cross-sectional view illustrating a schematic configuration of each of the light-emitting elements ESR, ESG, ESB of the light-emitting element layer 5 of the display device 1 according to the present embodiment. Note that hereinafter, when it is not necessary to particularly distinguish each of the light-emitting elements ESR, ESG, ESB, the light-emitting elements ESR, ESG, ESB are collectively and simply referred to as "light-emitting element ES".

As described above, the function layer 24 is a layer between the first electrode 22 and the second electrode 25 in the light-emitting element ES, and includes at least a light-emitting layer. In a case where the light-emitting element ES is a so-called OLED (organic light-emitting diode) that is referred to as an organic EL (electroluminescence) element, the function layer 24 is formed of an organic layer that is referred to as an organic EL layer. Note that the function layer 24 may be a single layer type formed only of a light-emitting layer, or may be a multi-layer type including a function layer other than the light-emitting layer. Note that the light-emitting element ES is not limited to an OLED, and may be, for example, a QLED (quantum dot light emitting diode).

As illustrated in FIG. 1, the function layer 24 in the light-emitting element ESR has a configuration in which, for example, a hole injection layer 41R, a hole transport layer 42R, a light-emitting layer 43R, a hole blocking layer 44R, an electron transport layer 45R, and an electron injection layer 46R are layered in this order from the first electrode 22 side. The function layer 24 in the light-emitting element ESG has a configuration in which, for example, a hole injection layer 41G, a hole transport layer 42G, a light-emitting layer 43G, a hole blocking layer 44G, an electron transport layer 45G, and an electron injection layer 46G are layered in this order from the first electrode 22 side. The function layer 24 in the light-emitting element ESB has a configuration in which, for example, a hole injection layer 41B, a hole transport layer 42B, a light-emitting layer 43B, a hole blocking layer 44B, an electron transport layer 45B, and an electron injection layer 46B are layered in this order from the first electrode 22 side.

Hereinafter, in a case where it is not necessary to particularly distinguish each of the hole injection layers 41R, 41G, 41B of the respective light-emitting elements ES, these hole injection layers 41R, 41G, 41B are collectively and simply referred to as the hole injection layer 41. Similarly, the hole transport layers 42R, 42G, 42B are collectively referred to as a hole transport layer 42. The light-emitting layers 43R, 43G, 43B are collectively referred to as a light-emitting layer 43. The hole blocking layers 44R, 44G, 44B are collectively referred to as a hole blocking layer 44. Also, the electron transport layers 45R, 45G, 45B are collectively referred to as an electron transport layer 45, and the electron injection layers 46R, 46G, 46B are collectively referred to as an electron injection layer 46.

Note that the above-described layering order is for a case in which the first electrode 22 is an anode electrode and the second electrode 25 is a cathode electrode, and in a case where the first electrode 22 is a cathode electrode and the second electrode 25 is an anode electrode, the order of the respective layers that constitute the function layer 24 is inverted. In addition, the configuration of the function layer 24 is not limited to the layer configuration illustrated above, and a desired layer configuration can be adopted depending on characteristics of the required light-emitting element ES.

In a case where the function layer 24 is formed by separately patterning vapor deposition such that the light-emitting element ES emits light of a different color for each subpixel SP, at least the light-emitting layer 43 of the function layer 24 is formed in each region (subpixel SP) surrounded by the bank 23 illustrated in FIG. 2.

Further, as illustrated in FIG. 1, the first electrode 22 of each light-emitting element ES includes a first transparent electrode 31, a reflective metal layer 32, a semi-transparent metal layer 33, and a second transparent electrode 34 in the order from the lower layer side (that is, the thin film transistor layer 4 side).

In other words, the first electrode 22 according to the present embodiment includes a configuration in which the semi-transparent metal layer 33 is inserted between interfaces of the reflective metal layer 32 and the second transparent electrode 34, in a reflective electrode having a three-layer structure in which the reflective metal layer 32 made of, for example, Ag (silver) is held between the first transparent electrode 31 and the second transparent electrode 34 that are each formed of, for example, ITO (indium tin oxide). The second transparent electrode 34 is disposed on the semi-transparent metal layer 33 as just described, and thus the second transparent electrode 34 serves as a protection layer for the reflective metal layer 32 and the semi-transparent metal layer 33 that have low process tolerability (low stability in etching, a peeling process), and the process tolerability can be ensured.

Note that the first transparent electrode 31 and the second transparent electrode 34 are not limited to ITO, and may be, for example, IZO (indium zinc oxide). An electrode material having a work function of, for example, 4.5 or greater that allows for an efficient hole injection into the function layer 24 is preferably used as a material of the first electrode 22 that is an anode electrode. Further, the second transparent electrode 34 functions as an optical path length adjustment layer that adjusts an optical path length between the reflective metal layer 32 and the light-emitting layer 43. Accordingly, a material that does not degrade luminance, light-emission characteristics, or the like of light from the light-emitting layer 43 as much as possible is preferably applied at least to the second transparent electrode 34. Therefore, the first transparent electrode 31 and the second transparent electrode 34 are preferably formed of ITO or IZO, which is, for example, a transparent electrode material having a large work function.

Furthermore, the reflective metal layer 32 is not limited to Ag, and may be, for example, Al (aluminum). As just described, the reflective metal layer 32 is preferably formed of, for example, Ag or Al having high reflectivity in order to increase the usage efficiency of light emitted from the light-emitting element layer 5.

The semi-transparent metal layer 33 is a semi-metal layer formed of a material, which has an absorption coefficient α of optical constants wherein α is not zero and an optical absorption effect can be confirmed. In addition, here, the fact that the absorption coefficient α of optical constants is not zero indicates that the absorption coefficient α is greater than 0 ($\alpha>0$). The semi-transparent metal layer 33 is preferably formed of a material having transparency and having a work function that allows for hole injection. More preferably, the semi-transparent metal layer 33 has a layer thickness of 50 nm or less and the work function is 4 eV or less.

The semi-transparent metal layer 33 is preferably a layer containing at least one type selected from the group consisting of, for example, MoSi (molybdenum silicide), MoOx (molybdenum oxide), WSi (tungsten silicide), WO (tungsten oxide), and NiO (nickel oxide). Note that in MoOx, x is specifically x≥2, and is more preferably greater than 2. Examples of MoOx include $MoO_3$ (molybdenum trioxide), $MoO_2$ (molybdenum dioxide), and molybdenum oxide in an intermediate oxidation state between $MoO_3$ and $MoO_2$ (hereinafter, referred to as $MoO_{3-y}$). Here, $MoO_{3-y}$ is a generic name of molybdenum oxide in an intermediate oxidation state between $MoO_3$ and $MoO_2$. Examples of $MoO_{3-y}$ include $Mo_4O_{11}$, $Mo_8O_{23}$, $Mo_9O_{26}$, $Mo_{17}O_{47}$, and the like.

Note that the semi-transparent metal layer 33 of these examples has a large work function and can efficiently inject holes into the function layer 24.

The specific resistance of the semi-transparent metal layer 33 is preferably in a range of $10^5$ to $10^{-2}$ Ωm to avoid an increase in operating voltage of the display device 1. Further, in order to reduce surface reflectivity of the display device 1, it is preferable that the absorption coefficient α of the optical constant of the semi-transparent metal layer 33 is not 0. When the absorption coefficient α of the semi-transparent metal layer 33 is $\alpha_{33}$ and the absorption coefficient α of the optical constant of the second transparent electrode 34 is $\alpha_{34}$, it is preferable that $\alpha_{33}$ is greater than $\alpha_{34}$ ($\alpha_{34}<\alpha_{33}$) in order to reduce reflectivity. In addition, when a refractive index n of the optical constant of the semi-transparent metal layer 33 is set $n_{33}$ and the refractive index n of the optical constant of the second transparent electrode 34 is set $n_{34}$, it is preferable that $n_{33}$ is greater than $n_{34}$ ($n_{34}<n_{33}$) in order to reduce reflectivity in the same way as above (in other words, it is easy to confine light in a layer having a high refractive index). More specifically, it is preferable that $\alpha_{33}$ is in a range of 0.1 to 10 in order to reduce reflectivity, and it is preferable that $\alpha_{34}$ is in a range of 0 to 0.1 similarly in order to reduce reflectivity. Also, it is preferable that $n_{33}$ is in a range of 2 to 7 in order to reduce reflectivity, and it is preferable that $n_{34}$ is in a range of 1 to 3 in order to reduce reflectivity (in combination with a material of the semi-transparent metal layer 33). Note that, in the simulation described below, as an example, ITO having a refractive index $n_{34}=2.1$ and an absorption coefficient $\alpha_{34}=0$ is used for the second transparent electrode 34, and MoSi having a refractive index $n_{33}=4.67$ and an absorption coefficient $\alpha_{33}=2.3$ is used for the semi-transparent metal layer 33.

A transparent electrode or a semi-transparent electrode is used for the second electrode 25, which is an electrode on the light extraction side, including the extending section 25'. For example, a semi-transparent electrode 51 made of a semi-transparent metal thin film may be used as a single substance for the second electrode 25. Also, the semi-transparent electrode 51 made of a semi-transparent metal thin film and a transparent electrode 52 may be used in combination for the second electrode 25. For example, when resistance of the semi-transparent electrode 51 is high and uniformity of light emission luminance is impaired, the transparent electrode 52 as an auxiliary electrode layer is layered on the semi-transparent electrode 51. In addition, an electrode material, for example, having a work function of 4.5 or less that allows for efficient electron injection into the function layer 24 is preferable as a material of the second electrode 25, which is a cathode electrode (in particular, as a material of the semi-transparent electrode 51). Examples of the semi-transparent electrode 51 (metal thin film) include metals such as Al (aluminum), Ag (silver), Au (gold), Mg (magnesium), Ca (calcium), Li (lithium), and Cr (chromium), or a thin film of an alloy containing these metals. Examples of the transparent electrode 52 include ITO, IZO, and the like.

As described above, the cap layer 26 is disposed covering the entire surface of the display region DA. The cap layer 26 functions as an optical adjustment layer that adjusts light emitted from the light-emitting element ES, and functions as a protection layer that protects the second electrode 25. A material that does not degrade luminance, light-emission characteristics, or the like of light from the light-emitting element ES as much as possible is used for the cap layer 26. The cap layer 26 may be formed of a single layer of an organic layer 61 or an inorganic layer 62, or may be formed of a layered body of the organic layer 61 and the inorganic layer 62 as illustrated in FIG. 1.

In a case where the cap layer 26 is formed of a single layer of the organic layer 61, the cap layer 26 may be formed of a layer containing aromatic hydrocarbons. Note that aromatic hydrocarbons in a layer containing aromatic hydrocarbons may be N,N'-Di-1-naphthyl-N,N'-diphenylbenzidine (also referred to as α-NPD or NPB). Meanwhile, in a case where the cap layer 26 is formed of a single layer of the inorganic layer 62, the cap layer 26 may be formed of a LiF (lithium fluoride) layer. In a case where the cap layer 26 is formed of a layered body of the organic layer 61 and the inorganic layer 62, the organic layer 61 may be a layer containing aromatic hydrocarbons and the inorganic layer 62 may be a LiF layer.

Additionally, as in the present embodiment, in a case where the cap layer 26 is formed of a layered body of the organic layer 61 and the inorganic layer 62, a refractive index in a visible light region of the organic layer 61 is preferably higher than a refractive index in a visible light region of the inorganic layer 62. Specifically, the refractive index in the visible light region of the organic layer 61 is preferably 1.8 or more and 2.1 or less, and the refractive index in the visible light region of the inorganic layer 62 is preferably 1.2 or more and 1.3 or less.

Next, the layer thickness of each of the layers in the light-emitting element ES will be described.

The layer thickness of the first transparent electrode 31 is preferably in a range of, for example, 5 to 30 nm. When the layer thickness of the first transparent electrode 31 is, for example, 5 nm or more, an increase in drive voltage caused by an increase in wiring resistance can be prevented. Meanwhile, when the layer thickness of the first transparent electrode 31 is 30 nm or less, the first electrode 22 can be wet-etched at once.

In addition, the layer thickness of the reflective metal layer 32 is preferably in a range of, for example, 60 to 120 nm. When the reflective metal layer 32 is, for example, 60 nm or more, high surface reflectivity can be maintained. Meanwhile, when the layer thickness of the reflective metal layer 32 is 120 nm or less, preparation of the reflective metal layer 32 and production of the display device 1 can be performed without reducing throughput.

The second transparent electrode 34 is wet-etched together with the underlying reflective metal layer 32 due to process factors. Therefore, the layer thickness of the second transparent electrode 34 is preferably in a range of, for example, 5 to 30 nm. When the layer thickness of the second transparent electrode 34 is, for example, 5 nm or more, film formation in which the layer thickness can be controlled can be performed. Meanwhile, when the layer thickness of the second transparent electrode 34 is, for example, 30 nm or less, the second transparent electrode 34 can be easily wet-etched together with the underlying reflective metal layer 32 and a decrease in luminance can be prevented without decreasing light transmittance. In addition, the layer thickness of the semi-transparent metal layer 33 will be described later.

In a case where the second electrode 25 is the semi-transparent electrode 51 made of a metal thin film, the layer thickness of the semi-transparent electrode 51 is preferably in a range of, for example, 10 to 50 nm. When the layer thickness of the semi-transparent electrode 51 is 10 nm or more, the surface is covered without creating step disconnections and thus can function as an electrode. Further, when the layer thickness of the semi-transparent electrode 51 is 50 nm or less, a decrease in luminance and luminous efficiency can be prevented without rapidly decreasing light transmittance. Furthermore, in a case where the transparent electrode 52 is disposed on the semi-transparent electrode 51, the layer thickness of the transparent electrode 52 is preferably in a range of, for example, 10 to 100 nm. When the layer thickness of the transparent electrode 52 is, for example, 10 nm or more, an increase in drive voltage caused by an increase in wiring resistance can be prevented. In addition, when the layer thickness of the transparent electrode 52 is 100 nm or less, a decrease in luminance can be prevented without decreasing light transmittance.

In a case where the cap layer 26 is formed of a single layer of the organic layer 61, the layer thickness of the cap layer 26 is preferably in a range of, for example 30 to 200 nm. In a case where the cap layer 26 is formed of a single layer of the inorganic layer 62, the layer thickness thereof is preferably in a range of, for example, 5 to 50 nm. Also, in a case where the cap layer 26 is formed of a layered body of the organic layer 61 and the inorganic layer 62, the layer thickness of the organic layer 61 is preferably thicker than the layer thickness of the inorganic layer 62. The layer thickness of the organic layer 61 is preferably in a range of 50 to 100 nm, and the layer thickness of the inorganic layer 62 is preferably in a range of 10 to 30 nm. Therefore, optical interference effects are exerted and light extraction can be improved.

The layer thickness of the function layer 24 (in other words, the distance between the first electrode 22 and the second electrode 25) is not particularly limited. The layer thickness of the function layer 24 is set, for example, in a range of 1 to 1000 nm, but is more preferably a range of 50 to 200 nm. When the layer thickness of the function layer 24 is, for example, 50 nm or more, pixel defects caused by foreign matters such as dusts can be prevented, and a decrease in luminous efficiency due to near field light can be suppressed. In addition, when the layer thickness of the function layer 24 is 200 nm or less, an increase in drive voltage caused by a resistive component of the function layer 24 can be suppressed. Note that, the layer thickness of each layer in the function layer 24 may be set as appropriate depending on the type thereof to obtain required characteristics of the light-emitting element ES, and the layer thickness is not particularly limited. In a case where color purity is improved by microcavity effects (interference effects), the layer thickness of each layer may be adjusted to an optimal layer thickness for each luminescent color to obtain the desired optical path length.

As illustrated in FIG. 1, light of 50%, half of the light emitted by each of the light-emitting layers 43R, 43G, and 43B is emitted to the outside directly from the second electrode 25 side. Meanwhile, the remaining 50% of the light emitted by each of the light emitting layers 43R, 43G, 43B is reflected by the semi-transparent metal layer 33 or the reflective metal layer 32 and is returned to each of the light-emitting layers 43R, 43G, 43B to be emitted from each of the light-emitting layers 43R, 43G, 43B to the outside. Therefore, the light from each of the light-emitting layers 43R, 43G, and 43B through the semi-transparent metal layer 33 toward the reflective metal layer 32 is preferably reflected by the semi-transparent metal layer 33 or the reflective metal layer 32 and utilized as much as possible. On the other hand, reflection of external light incident from the outside into the display device 1 is preferably suppressed as much as possible.

Accordingly, when a peak wavelength of a luminescent color of the light emitted from the light-emitting element ES is $\lambda$, an optical distance between the light-emitting layer 43 and the reflective metal layer 32 is L1, and an optical distance between the light-emitting layer 43 and the semi-transparent metal layer 33 is L2, the optical distance L1 or L2 is preferably set such that $L1=(2m-1)/4 \times \lambda$, (m is an integer of 1 or greater) or $L2=(2m-1)/4 \times \lambda$, (m is an integer of 1 or greater). More specifically, the optical distance L is preferably set such that $L1=\frac{3}{4} \times \lambda$, or $L2=\frac{3}{4} \times \lambda$.

Note that the optical distance between each of the light-emitting layers 43R, 43G, 43B and the reflective metal layer 32 is expressed as the sum of the products of the refractive index n of each of the layers between each of the light-emitting layers 43R, 43G, 43B and the reflective metal layer 32 and the layer thickness.

Therefore, in the example illustrated in FIG. 1, the optical distance is preferable set as follows. Additionally, in the following, in order to distinguish the peak wavelength of the luminescent color of the light emitted from each light-emitting element ES, a peak wavelength of a luminescent color of blue of the light emitted from the light-emitting element ESB is $\lambda_B$, a peak wavelength of a luminescent color of green of the light emitted from the light-emitting element ESG is $\lambda_G$, and a peak wavelength of a luminescent color of red of the light emitted from the light-emitting element ESR is $\lambda_R$. Moreover, an optical distance between the light-emitting layer 43B and the reflective metal layer 32 is $L_B$, an optical distance between the light-emitting layer 43G and the reflective metal layer 32 is $L_G$, and an optical distance between the light-emitting layer 43R and the reflective metal layer 32 is $L_R$.

At this time, in the display device 1 according to the present embodiment, in a blue subpixel, an optical distance $L_{B1}$ between the light-emitting layer 43B and the reflective metal layer 32 in the light-emitting element ESB illustrated in FIG. 1 (that is, the sum of the products of the refractive index n and the layer thickness of each layer of the semi-transparent metal layer 33, the second transparent electrode 34, the hole injection layer 41B, and the hole transport layer 42B), or an optical distance $L_{B2}$ between the light-emitting layer 43B and the semi-transparent metal layer 33 (that is, the sum of the products of the refractive index n and the layer thickness of each layer of the second transparent electrode 34, the hole injection layer 41B, and the hole transport layer 42B) is $(2m_B-1)/4 \times \lambda_B$ ($m_B$ is an integer of 1 or greater), and, for example, is preferably set such that $\frac{3}{4} \times \lambda_B$. Also, in a green subpixel, an optical distance $L_{G1}$ between the light-emitting layer 43G and the reflective metal layer 32 in the light-emitting element ESG illustrated in FIG. 1 (that is, the sum of the products of the refractive index n and the layer thickness of each layer of the semi-transparent metal layer 33, the second transparent electrode 34, the hole injection layer 41G, and the hole transport layer 42G), or an optical distance $L_{G2}$ between the light-emitting layer 43G and the semi-transparent metal layer 33 (that is, the sum of the products of the refractive index n and the layer thickness of each layer of the second transparent electrode 34, the hole injection layer 41G, and the hole transport layer 42G) is $(2m_G-1)/4 \times \lambda_G$ ($m_G$ is an integer of 1 or greater), and, for example, is preferably set such that $\frac{3}{4} \times k_G$. In a red subpixel, an optical distance $L_{R1}$ between the light-emitting layer 43R and the reflective metal layer 32 in the light-emitting element ESR illustrated in FIG. 1 (that is, the sum of the products of the refractive index n and the layer thickness of each layer of the semi-transparent metal layer 33, the second transparent electrode 34, the hole injection layer 41R, and the hole transport layer 42R), or an optical distance $L_{R2}$ between the light-emitting layer 43R and the semi-transparent metal layer 33 (that is, the sum of the products of the refractive index n and the layer thickness of each layer of the second transparent electrode 34, the hole injection layer 41R, and the hole transport layer 42R) is $(2m_R-1)/4 \times \lambda_R$ ($m_R$ is an integer of 1 or greater), and, for example, is preferably set such that $L_R = \frac{3}{4} \times \lambda_R$. Therefore, the light having a specific peak wavelength can be efficiently extracted from each light-emitting layer 43.

In addition, for management of the layer thickness, a distance between the semi-transparent metal layer 33 and the second electrode 25 is preferably in a range of 0.9 to 1.5 times, more preferably in a range of 1.0 to 1.4 times, and particularly preferably 1.0 times the optical distance L between the light-emitting layer 43 and the reflective metal layer 32.

In addition, when incident light intensity is $I_0$, transmitted light intensity is I, and reflectivity is R ($=I/I_0$), reflectivity R is expressed as $R=\exp(-\alpha d)$ by Lambert-Beer's law $I=I_0 \exp(-\alpha d)$. Here, d denotes the thickness of the light-emitting element ES, and a denotes the absorption coefficient of the light-emitting element ES. Therefore, by using the above equation, the relationship between the thickness of the light-emitting element ES and the reflectivity of the light-emitting element ES can be determined. Consequently, by using the above equation, optical effects can be estimated.

The layer thickness of the semi-transparent metal layer 33 is preferably in a range of, for example, 1 to 5 nm, is more preferably in a range of 2 nm or more and below 5 nm, and is particularly preferably 2 nm. The reason for this will be described below.

Figure 3:
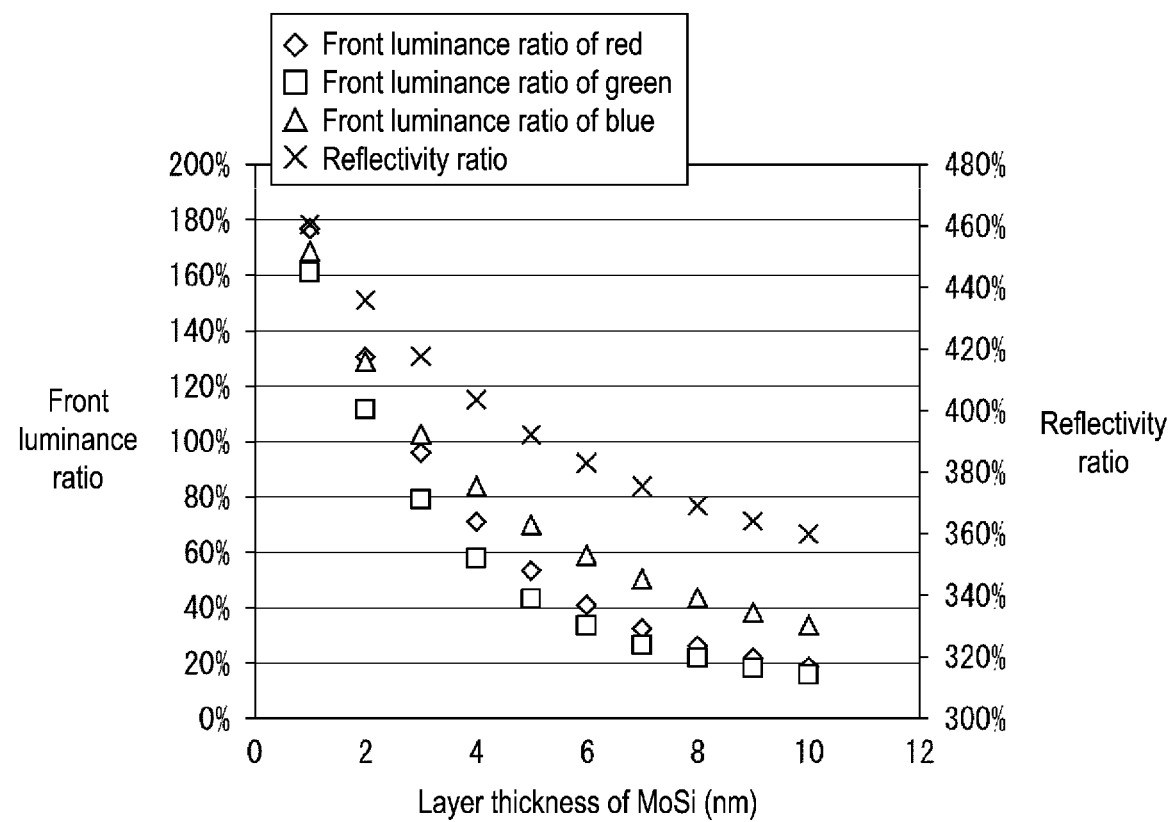
FIG. 3 is a graph showing the relationships between a layer thickness of a semi-transparent metal layer when MoSi is used as the semi-transparent metal layer and each of front luminance ratios of red, green, and blue of a display device in which the semi-transparent metal layers having respective layer thicknesses are provided, to front luminance of a display device with a circular polarizer; and the relationship between the layer thickness of the semi-transparent metal layer and a reflectivity ratio of reflectivity of the display device in which the semi-transparent metal layers having the respective layer thicknesses are provided, to reflectivity of the display device with the circular polarizer.

FIG. 3 is a graph showing the relationships between the layer thickness of the semi-transparent metal layer 33 when MoSi is used as the semi-transparent metal layer 33 and each of front luminance ratios of red, green, and blue of the display device 1 in which the semi-transparent metal layers 33 having the respective layer thicknesses are provided, to front luminance of a display device with a circular polarizer, which is used as a reference, when reflectivity of the display device with the circular polarizer is regarded as 100%; and the relationship between the layer thickness of the semi-transparent metal layer 33 and a reflectivity ratio of reflectivity (external light reflectivity hereinafter referred to as "panel reflectivity") of the display device 1 in which the semi-transparent metal layers 33 having the respective layer thicknesses are provided, to the reflectivity (panel reflectivity) of the display device with the circular polarizer, which is used as a reference, when the reflectivity (panel reflectivity) of the display device with the circular polarizer is regarded as 100%. Further, Table 1 shows the relationships between the layer thickness of the semi-transparent metal layer 33 when the MoSi is used as the semi-transparent metal layer 33 and each of the front luminance ratios of red, green, and blue of the display device 1. Furthermore, Table 2 shows the relationship between the layer thickness of the semi-transparent metal layer 33 when MoSi is used as the semi-transparent metal layer 33 and the reflectivity (panel reflectivity) of the display device 1 and the relationship between the layer thickness of the semi-transparent metal layer 33 and the reflectivity ratio (%) to the reflectivity (panel reflectivity indicated by "Ref" in Table 2) of the display device for comparison. In addition, Table 3 shows the reflectivity of each subpixel (external light reflectivity of each subpixel) of each color of red, green, and blue when the display device 1 is not provided with the semi-transparent metal layers 33; and the relationships between the layer thickness of the semi-transparent metal layer 33 in the display device 1 and the reflectivity of each subpixel (external light reflectivity of each subpixel) of each color of red, green, and blue.

Note that the panel reflectivity (external light reflectivity of the display device) refers to reflectivity of the entire surface of a display panel of the display device, which is formed of the openings of the subpixels SP of the respective colors R, G, B and the banks 23, and the panel reflectivity is indicated by the sum of products of the respective reflectivity and an area ratio in the opening of the subpixel SP of each of the aforementioned colors and the bank. In addition, the reflectivity of each subpixel (external light reflectivity of each subpixel) is a ratio occupied by the reflectivity of the opening of the subpixel SP of each color, in the reflectivity of the entire surface of the display panel of the display device, and the reflectivity of each subpixel is indicated by the sum of products of the reflectivity and the area ratio of the opening of the subpixel SP of each color, with respect to the sum of products of the respective reflectivity and the area ratio in the opening of the subpixel SP of each of the aforementioned colors and the bank.

The panel reflectivity can be estimated by the respective reflectivity, measured with a microspectrophotometer ("OPTM series" available from Otsuka Electronics Co. Ltd.), in the opening of the subpixel SP of each color of R, G, B and the bank surface and the area ratios of the opening and the bank surface in the entirety, and emission characteristics in the subpixel SP of each color of R, G, B of the light-emitting element ES of each color may be estimated by an OLED element simulator, "Setfos" available from Cybernet Systems Co., Ltd.

Note that a display device with a circular polarizer in which the semi-transparent metal layers 33 are not provided is used as the display device for comparison. In addition, the reflectivity ratio of the right column in Table 2 and the reflectivity ratio in FIG. 3 indicate a reflectivity ratio of reflectivity of the display device 1 in which the semi-transparent metal layers 33 having the respective layer thicknesses are provided, to the reflectivity of the display device with the circular polarizer, when the reflectivity of the display device with the circular polarizer, which is the display device for comparison and obtained by the simulation above, is regarded as 100% and when the layer thickness of the semi-transparent metal layer 33, the semi-transparent metal layer 33 provided instead of the circular polarizer, is variously changed in a range of 1 to 10 nm.

Note that the configuration of the display device 1 used in the simulation described above (hereinafter, referred to as "configuration A") is as follows.

Organic layer 61 (cap layer 26, α-NPD) 78 nm
Transparent electrode 52 (second electrode 25, Ag) 24 nm
Semi-transparent electrode 51 (second electrode 25, Mg—Ag alloy) 1 nm
Electron injection layer 46R (LiF) 0.5 nm. electron injection layer 46G (LiF) 0.5 nm. electron injection layer 46B (LiF) 0.5 nm
Electron transport layer 45R (Bphen (4,7-diphenyl-1,10-phenanthroline)) 15 nm, electron transport layer 45G (Bphen) 15 nm, electron transport layer 45B (Bphen) 15 nm
Hole blocking layer 44R (BCP (2,9-dimethyl-4,7-diphenyl-1.10-phenanthroline)) 40 nm, hole blocking layer 44G (BCP) 40 nm, hole blocking layer 44B (BCP) 25 nm
Light-emitting layer 43R (BeBq2 (bis(10-hydroxybenzo[h]quinolinato)beryllium(II)): Ir(piq)3(tris(1-phenylisoquinoline) iridium(III)) 20 nm, light-emitting layer 43G (TCTA (4,4',4"-tris-(N-carbazolyl)-triphenylamine):Ir (ppy)3 (ortho metalation iridium complex)) 20 nm, light-emitting layer 43B (DPVBi (4.4'-bis(2,2-diphenylvinyl)biphenyl):BczVBi (4,4'-bis(9-ethyl-3-carbazovinylene)-1, 1'-biphenyl) 10 nm
Hole transport layer 42R (α-NPD(N,N'-di(1-naphthyl)-N,N'-diphenylbenzidine)) 10 nm, hole transport layer 42G (α-NPD) 10 nm, hole transport layer 42B (α-NPD) 10 nm
Hole injection layer 41R (α-NPD: $MoO_3$) 200 nm, hole injection layer 41G (α-NPD: $MoO_3$) 145 nm, hole injection layer 41B (α-NPD: $MoO_3$) 115 nm
Second transparent electrode 34 (ITO, first electrode 22) 19 nm
Semi-transparent metal layer 33 (MoSi, first electrode 22) changed in a range of 1 to 10 nm
Reflective metal layer 32 (Ag, first electrode 22) 100 nm
Glass substrate 0.7 mm In addition, the configuration of a display device for comparison used in the simulation described above (hereinafter, referred to as "configuration B") is as follows.

Circular polarizer (transmittance 42.5% (full wave length range))
Organic layer 61 (cap layer 26, α-NPD) 78 nm
Transparent electrode 52 (second electrode 25, Ag) 24 nm
Semi-transparent electrode 51 (second electrode 25, Mg—Ag alloy) 1 nm
Electron injection layer 46R (LiF) 0.5 nm, electron injection layer 46G (LiF) 0.5 nm, electron injection layer 46B (LiF) 0.5 nm
Electron transport layer 45R (Bphen) 15 nm, electron transport layer 45G (Bphen) 15 nm, electron transport layer 45B (Bphen) 15 nm
Hole blocking layer 44R (BCP) 40 nm, hole blocking layer 44G (BCP) 40 nm, hole blocking layer 44B (BCP) 25 nm
Light-emitting layer 43R (BeBq2:IR(piq)3) 20 nm, light-emitting layer 43G (TCTA:Ir(ppy)3) 20 nm, light-emitting layer 43B (DPVBi:BczVBi) 10 nm
Hole transport layer 42R (α-NPD) 10 nm, hole transport layer 42G (α-NPD) 10 nm, hole transport layer 42B (α-NPD) 10 nm
Hole injection layer 41R (α-NPD: $MoO_3$) 200 nm, hole injection layer 41G (α-NPD: $MoO_3$) 145 nm, hole injection layer 41B (α-NPD: $MoO_3$) 115 nm
Second transparent electrode 34 (ITO, first electrode 22) 19 nm
Reflective metal layer 32 (Ag, first electrode 22) 100 nm
Glass substrate 0.7 mm.

Note that for an aperture ratio of each subpixel in the display device 1 and the display device for comparison, the aperture ratio of the blue subpixel is 10%, the aperture ratio of the green subpixel is 12%, and the aperture ratio of the red subpixel is 8%.

TABLE 1

| | Front luminance ratio (%) | | |
|---|---|---|---|
| Layer thickness of MoSi (nm) | Red | Green | Blue |
| 1 | 177 | 161 | 169 |
| 2 | 130 | 112 | 129 |
| 3 | 96 | 79 | 103 |
| 4 | 71 | 58 | 84 |
| 5 | 53 | 43 | 70 |
| 6 | 41 | 34 | 59 |
| 7 | 32 | 27 | 50 |
| 8 | 26 | 22 | 44 |
| 9 | 22 | 18 | 38 |
| 10 | 19 | 16 | 34 |

TABLE 2

| Layer thickness of MoSi (nm) | Reflectivity (%) | Reflectivity ratio (%) |
|---|---|---|
| 0 (Ref) | 5.3 | 100 |
| 1 | 24.2 | 461 |
| 2 | 22.9 | 436 |
| 3 | 22.0 | 418 |
| 4 | 21.2 | 403 |
| 5 | 20.6 | 392 |
| 6 | 20.1 | 383 |
| 7 | 19.7 | 375 |

TABLE 2-continued

| Layer thickness of MoSi (nm) | Reflectivity (%) | Reflectivity ratio (%) |
|---|---|---|
| 8 | 19.4 | 369 |
| 9 | 19.1 | 346 |
| 10 | 18.9 | 360 |

TABLE 3

| Layer thickness of MoSi (nm) | Reflectivity (%) | | |
|---|---|---|---|
| | Red | Green | Blue |
| 0 | 91.5 | 85.4 | 84.5 |
| 1 | 85.9 | 78.8 | 77.0 |
| 2 | 82.4 | 74.6 | 71.5 |
| 3 | 79.7 | 71.7 | 67.2 |
| 4 | 77.5 | 69.6 | 63.9 |
| 5 | 75.6 | 68.0 | 61.3 |
| 6 | 73.9 | 66.7 | 59.3 |
| 7 | 72.4 | 65.7 | 57.8 |
| 8 | 71.0 | 64.8 | 56.6 |
| 9 | 69.7 | 64.2 | 55.8 |
| 10 | 68.6 | 63.7 | 55.3 |

As shown in Table 2 and FIG. 3, the rate of decrease in reflectivity ratio when the layer thickness of the semi-transparent metal layer 33 is 7 nm or more is smaller than the rate of decrease in reflectivity ratio when the layer thickness of the semi-transparent metal layer 33 is 7 nm. Therefore, it is conceived that the function of the layer thickness of the semi-transparent metal layer 33 and the reflectivity ratio has an inflection point near a point at which the layer thickness of the semi-transparent metal layer 33 is 7 nm. However, for example, when the aperture ratio of the blue subpixel is 10%, the aperture ratio of the green subpixel is 12%, and the aperture ratio of the red subpixel is 8% as described above, the front luminance is reduced by half, as shown in Table 1 and FIG. 3, when the layer thickness of the semi-transparent metal layer 33 is 5 nm. Consequently, the layer thickness of the semi-transparent metal layer 33 is preferably 5 nm or less, and is more preferably below 5 nm. Meanwhile, in order to reduce surface reflectivity, the layer thickness of the semi-transparent metal layer 33 is preferably 1 nm or more. Further, when the layer thickness of the semi-transparent metal layer 33 is 2 nm, the effect of reducing reflectivity, which is equivalent to a case where the layer thickness of the semi-transparent metal layer 33 is 5 nm can be obtained, and there is little decrease in front luminance. Therefore, the layer thickness of the semi-transparent metal layer 33 is more preferably 2 nm or more, and is particularly preferably 2 nm. Furthermore, as can be seen from the results shown in Table 3, the range of 1 to 5 nm as a range of the layer thickness of the semi-transparent metal layer 33 is a well-balanced range between the decrease in reflectivity of the light-emitting element ES of each color and the front luminance.

Additionally, the fact that the reflectivity ratio exceeds 100% in Table 2 and FIG. 3 indicates that the display device 1 is not provided with a circular polarizer; therefore, the absorption of light by the circular polarizer is suppressed and thus the usage efficiency of the light emitted from each of the light-emitting layers 43R, 43G, 43B is high. In other words, according to the present embodiment, the display device 1 having high usage efficiency of light can be provided compared with a display device with a circular polarizer.

Figure 4:
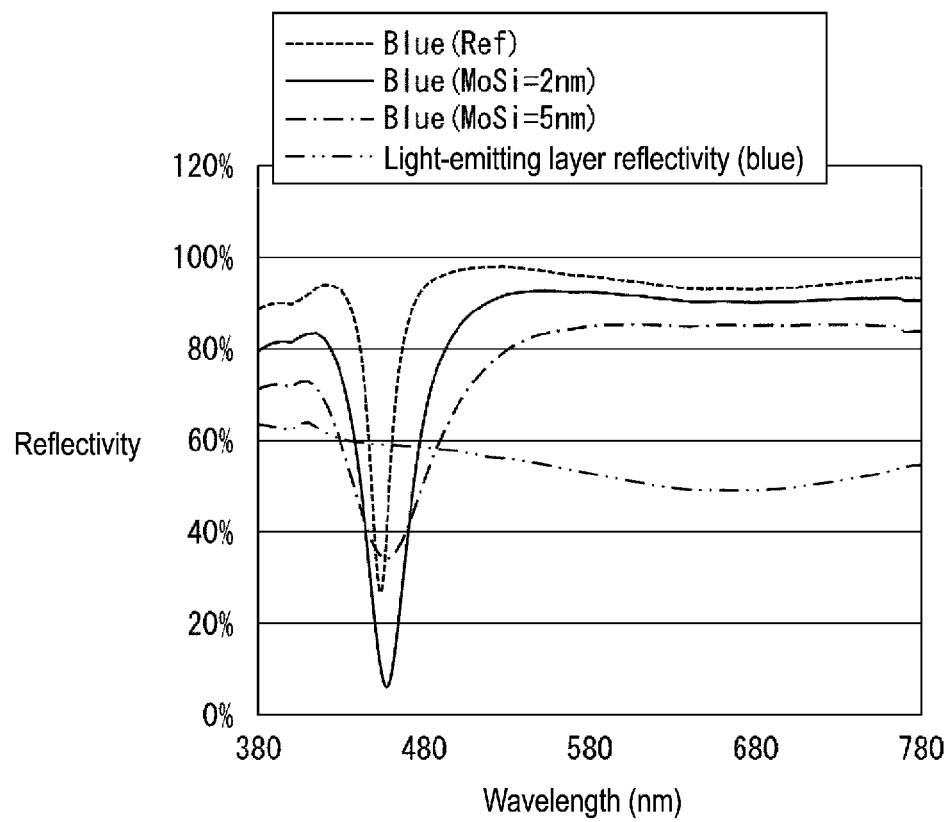
FIG. 4 is a graph showing the relationship between light-emitting layer reflectivity from a light-emitting layer in a blue color light-emitting element and wavelengths; and the relationships between reflectivity from a reflective metal layer in the blue color light-emitting element provided with MoSi having a layer thickness of 2 nm or 5 nm, as a semi-transparent metal layer, and wavelengths.
Figure 5:
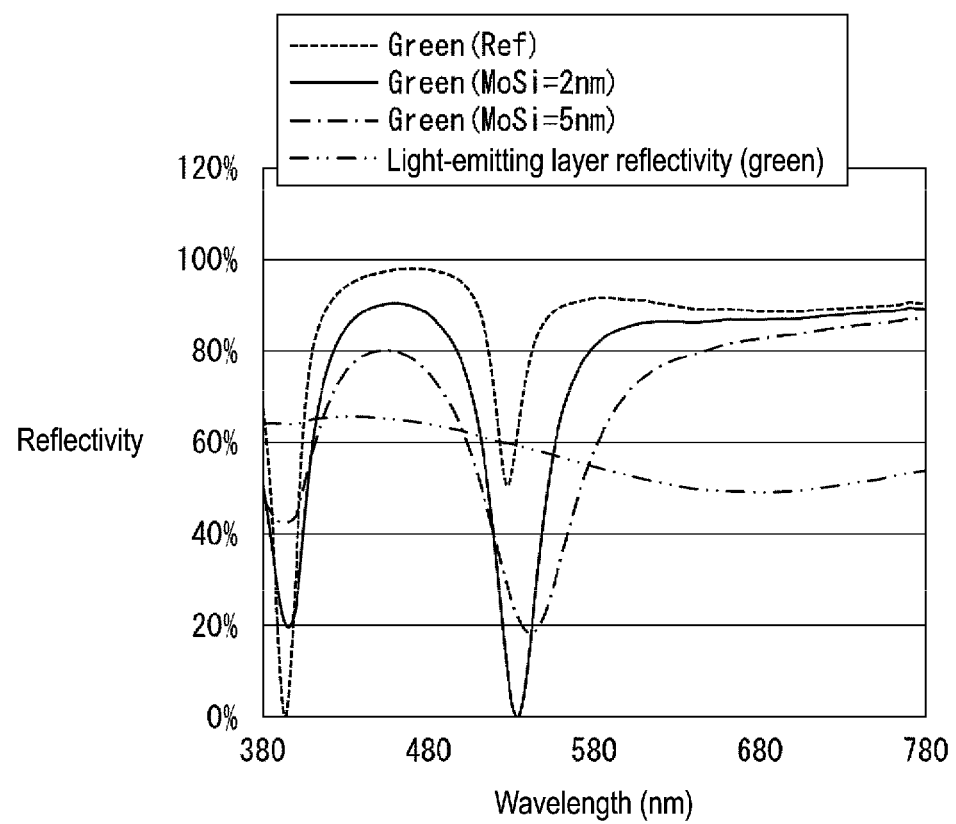
FIG. 5 is a graph showing the relationship between light-emitting layer reflectivity from a light-emitting layer in a green color light-emitting element and wavelengths; and the relationships between reflectivity from a reflective metal layer in the green color light-emitting element provided with MoSi having a layer thickness of 2 nm or 5 nm, as a semi-transparent metal layer, and wavelengths.
Figure 6:
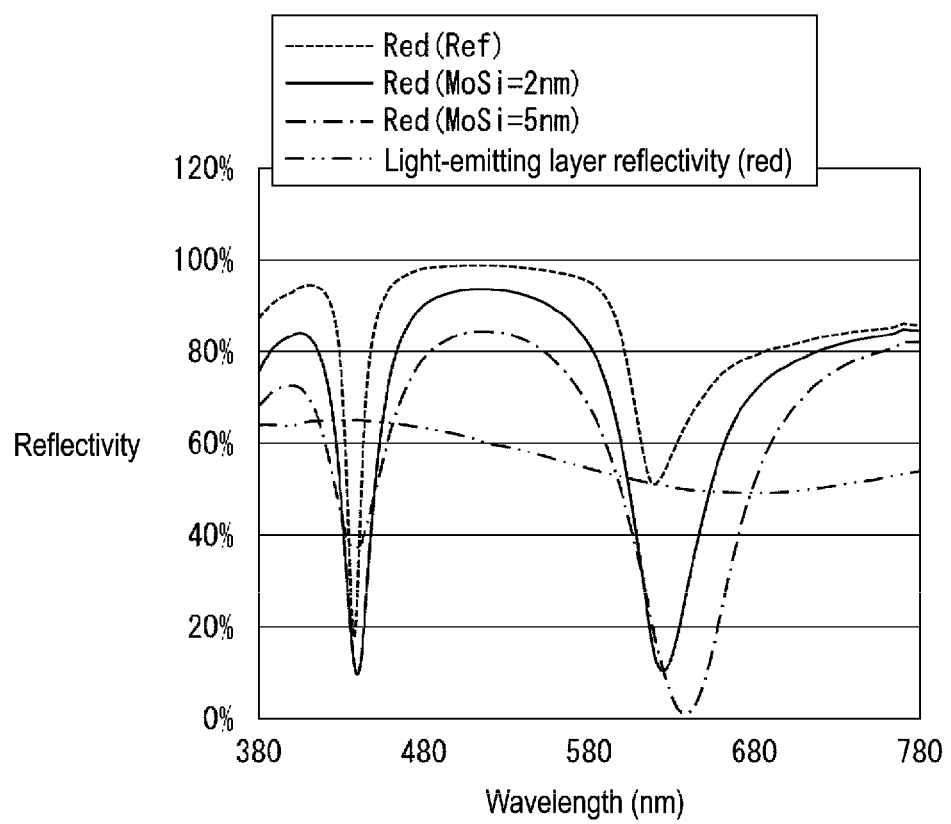
FIG. 6 is a graph showing the relationship between light-emitting layer reflectivity from a light-emitting layer in a red color light-emitting element and wavelengths; and the relationships between reflectivity from a reflective metal layer in the red color light-emitting element provided with MoSi having a layer thickness of 2 nm or 5 nm, as a semi-transparent metal layer, and wavelengths.

Further, the relationship between light-emitting layer reflectivity from the light-emitting layer 43B in the light-emitting element ESB as a blue color light-emitting device and wavelengths and the relationships between reflectivity from the reflective metal layer 32 in the light-emitting element ESB provided with MoSi having a layer thickness of 2 nm or 5 nm, as the semi-transparent metal layer 33, and wavelengths are indicated in FIG. 4. Furthermore, the relationship between light-emitting layer reflectivity from the light-emitting layer 43G in the light-emitting element ESG as a green color light-emitting device and wavelengths and the relationships between reflectivity from the reflective metal layer 32 in the light-emitting element ESG provided with MoSi having a layer thickness of 2 nm or 5 nm, as the semi-transparent metal layer 33, and wavelengths are indicated in FIG. 5. The relationship between light-emitting layer reflectivity from the light-emitting layer 43R in the light-emitting element ESR as a red color light-emitting device and wavelengths and the relationships between reflectivity from the reflective metal layer 32 in the light-emitting element ESR provided with MoSi having a layer thickness of 2 nm or 5 nm, as the semi-transparent metal layer 33, and wavelengths are indicated in FIG. 6.

Note that, here, the light-emitting layer reflectivity from each of the light-emitting layers 43R, 43G, 43B refers to reflectivity of a configuration from each light-emitting layer 43R, 43G, 43B to the cap layer 26 (that is, each light-emitting layer 43R, 43G, 43B, the second electrode 25, and the cap layer 26). In addition, the reflectivity from the reflective metal layer 32 in each of the light-emitting elements ESR, ESG, ESB refers to reflectivity of light reflected by the reflective metal layer 32 in each light-emitting element ESR, ESG, ESB (external light and light emitted by each light-emitting layer 43R, 43G, 43B).

Moreover, an average reflectivity that is reflectivity simply averaged at wavelength between 380 to 780 nm in each of the light-emitting elements ESR, ESG, ESB for comparison (indicated by "Ref" in Table 4), not provided with the semi-transparent metal layer 33; an average reflectivity of each of the light-emitting elements ESR, ESG, ESB that is reflectivity simply averaged at wavelength between 380 to 780 nm in each of the light-emitting elements ESR, ESG, ESB provided with MoSi having a layer thickness of 2 nm or 5 nm, as the semi-transparent metal layer 33; and an average light-emitting layer reflectivity of each of the light-emitting elements ESR, ESG, ESB that is light-emitting layer reflectivity simply averaged at wavelength between 380 to 780 nm in each of the light-emitting elements ESR, ESG, ESB are all shown in Table 4.

Further, the reflectivity from the reflective metal layer 32 and the light-emitting layer reflectivity are respectively estimated by the following methods. Furthermore, the average reflectivity from the reflective metal layer 32 and the average light-emitting layer reflectivity are respectively estimated by the aforementioned "Setfos" available from Cybernet Systems Co., Ltd.

Note that the layer configuration used in the estimation (simulation) of the reflectivity from the reflective metal layer 32 is the same as that of the configuration A.

TABLE 4

| | ESR | ESG | ESB |
|---|---|---|---|
| Average reflectivity (Ref) | 84.5% | 85.4% | 91.5% |
| Average reflectivity (MoSi 2 nm) | 71.5% | 74.6% | 82.4% |

TABLE 4-continued

|  | ESR | ESG | ESB |
|---|---|---|---|
| Average reflectivity (MoSi 5 nm) | 61.3% | 68.0% | 75.6% |
| Average light-emitting layer reflectivity | 56.4% | 56.6% | 54.6% |

As seen from the results shown in FIGS. 4 to 6, the semi-transparent metal layer 33 (the semi-transparent metal layer 33 having the layer thickness of, for example, 2 nm or 5 nm in the examples shown in FIGS. 4 to 6) is provided; thereby, light at the peak wavelength of the luminescent color of each of the light-emitting elements ESR, ESG, ESB and light at the peak wavelength of a complementary color to the luminescent color can be absorbed and reflection of the light of these peak wavelengths can be suppressed. Further, as seen from the results shown in Table 4, the semi-transparent metal layer 33 having the layer thickness of 2 nm or 5 nm is provided; thereby, the average reflectivity can be decreased by approximately 10 to 20% compared to each of the light-emitting elements ESR, ESG, ESB for comparison indicated by Ref.

As described above, according to the present embodiment, the reflectivity of the light at the peak wavelength of the luminescent color of each of the light-emitting elements ESR, ESG, ESB and the reflectivity of the light at the peak wavelength of the complementary color to the luminescent color are suppressed; thereby, contrast of the luminescent color of each of the light-emitting elements ESR, ESG, ESB can be enhanced, and transmittance of the light at the peak wavelength of the luminescent color of each of the light-emitting elements ESR, ESG, ESB can be enhanced. Further, since the reflectivity can be suppressed, the directivity can also be reduced. Furthermore, since the semi-transparent metal layer 33 is thin as described above, the resistance is less of a problem.

In addition, at this time, the semi-transparent metal layer 33 suppresses reflectivity of external light incident into each subpixel and having the same wavelength as the peak wavelength of the luminescent color of the light-emitting element ES in each subpixel, while the optical distance L between the light-emitting layer 43 of the light-emitting element ES and the reflective metal layer 32 in each subpixel is set such that $L1=¾×\lambda$, and thereby the usage efficiency of light emitted from each light-emitting layer 43 toward the first electrode 22 side from each light-emitting layer 43 is improved. Therefore, the transmittance of light at the peak wavelength of the luminescent color of each of the light-emitting elements ESR, ESG, ESB can be further enhanced.

Moreover, according to the present embodiment, since the reflectivity of the external light can be suppressed as described above, the interference effects between the light emitted directly from the light-emitting layer 43 to the outside and the reflected light of the external light decrease. As a result, viewing angle characteristics can be improved compared to a case where the semi-transparent metal layer 33 is not provided.

Figure 7:
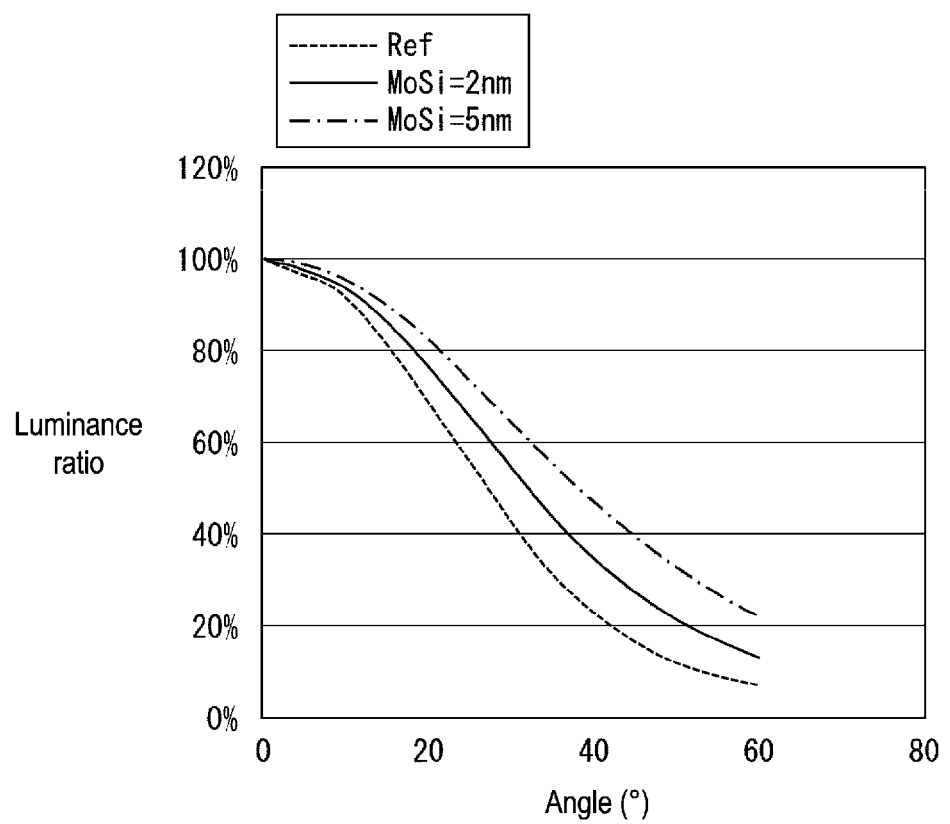
FIG. 7 is a graph showing angular dependence of a blue color light-emitting element not provided with a semi-transparent metal layer for comparison; and angular dependence of a blue color light-emitting element provided with MoSi having a layer thickness of 2 nm or 5 nm, as a semi-transparent metal layer.
Figure 8:
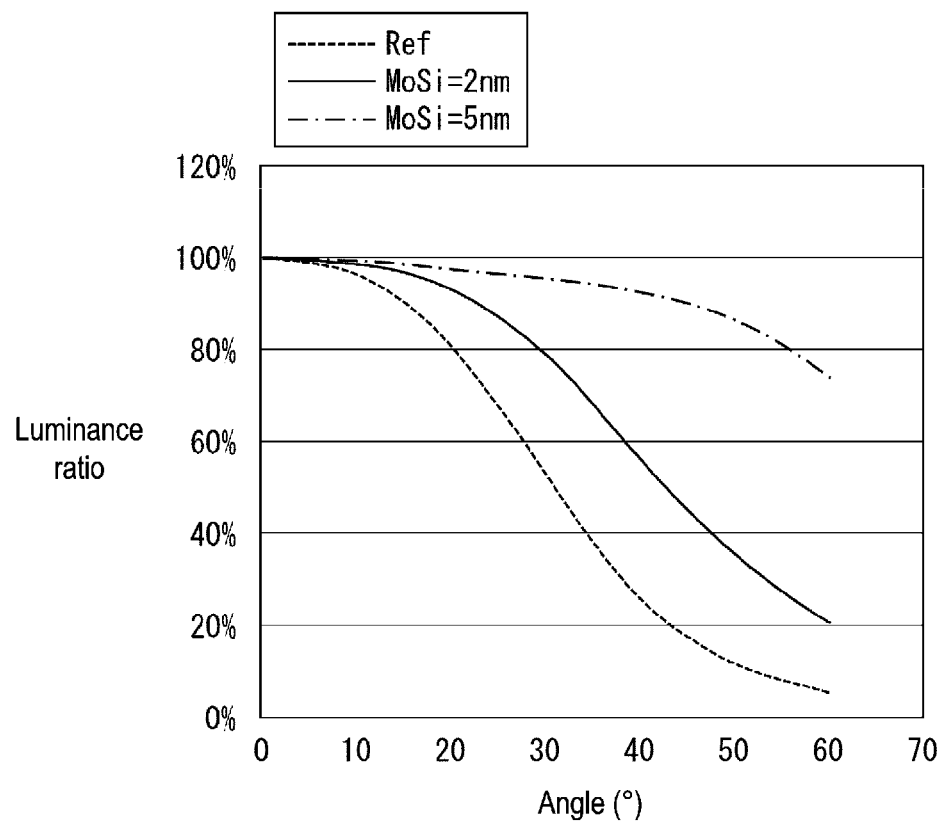
FIG. 8 is a graph showing angular dependence of a green color light-emitting element not provided with a semi-transparent metal layer for comparison; and angular dependence of a green color light-emitting element provided with MoSi having a layer thickness of 2 nm or 5 nm, as a semi-transparent metal layer.
Figure 9:
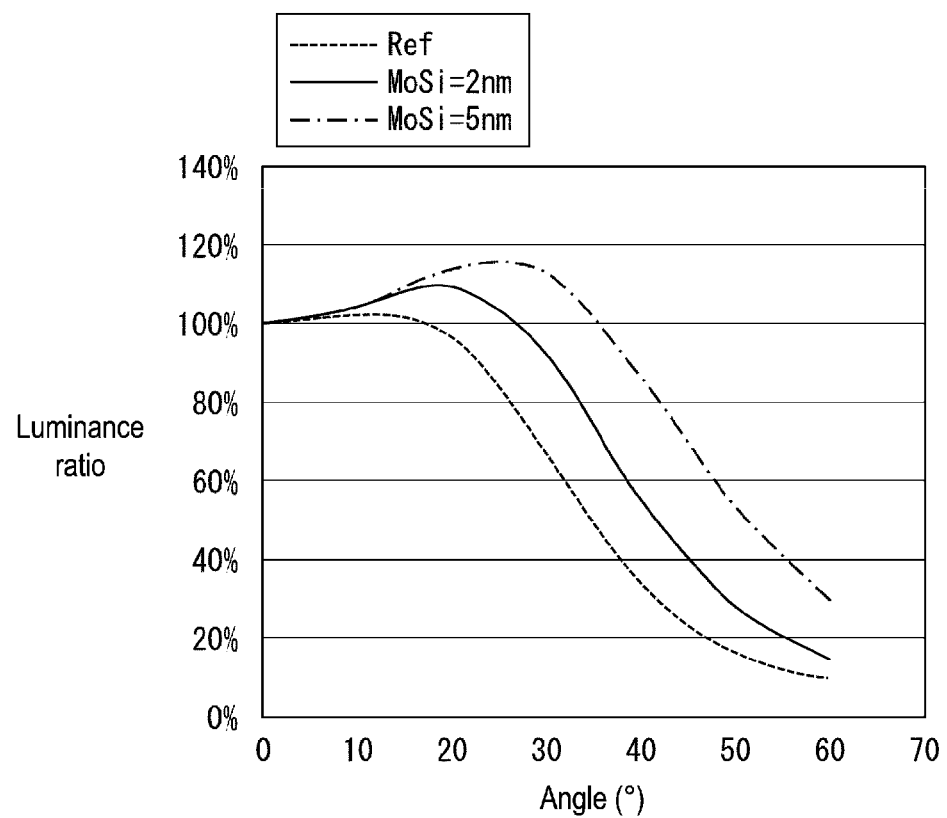
FIG. 9 is a graph showing angular dependence of a red color light-emitting element not provided with a semi-transparent metal layer for comparison; and angular dependence of a red color light-emitting element provided with MoSi having a layer thickness of 2 nm or 5 nm, as a semi-transparent metal layer.

FIG. 7 is a graph showing angular dependence of the light-emitting element ESB (indicated by "Ref" in FIG. 7), not provided with the semi-transparent metal layer 33 for comparison and angular dependence of the light-emitting element ESB provided with MoSi having a layer thickness of 2 nm or 5 nm, as the semi-transparent metal layer 33. Also, FIG. 8 is a graph showing angular dependence of the light-emitting element ESG (indicated by "Ref" in FIG. 8), not provided with the semi-transparent metal layer 33 for comparison and angular dependence of the light-emitting element ESG provided with MoSi having a layer thickness of 2 nm or 5 nm, as the semi-transparent metal layer 33. FIG. 9 is a graph showing angular dependence of the light-emitting element ESR (indicated by "Ref" in FIG. 9), not provided with the semi-transparent metal layer 33 for comparison and angular dependence of the light-emitting element ESR provided, as the semi-transparent metal layer 33, with MoSi having a layer thickness of 2 nm or 5 nm, as the semi-transparent metal layer 33. In addition, Table 5 shows the rate of decrease in front luminance (front luminance ratio) in each of the light-emitting elements ESR, ESG, ESB with consideration of the absorption rate in the semi-transparent metal layer 33.

Note that in FIGS. 7 to 9, the angular dependence refers to the relationship between an angle, when the front side is 0° and the front luminance of the light-emitting element indicated by Ref is 100%, and a luminance ratio to the front luminance. In addition, the front luminance ratio shown in Table 5 indicates the front luminance ratio of each light-emitting element when the front luminance of the light-emitting element indicated by Ref is 100%.

Note that for each of the front luminance, the front luminance ratio, and the angular dependence, light emission luminance in each light-emitting direction is estimated and compared by using the aforementioned "Setfos" available from Cybernet Systems Co., Ltd.

Additionally, the same layer configuration as that used in the estimation (simulation) of the reflectivity from the reflective metal layer 32 shown in FIGS. 4 to 6 is used in the estimation (simulation) of the front luminance, the front luminance ratio, and the angular dependence.

TABLE 5

|  | ESR | ESG | ESB |
|---|---|---|---|
| Front luminance ratio (Ref) | 100% | 100% | 100% |
| Front luminance ratio (MoSi 2 nm) | 55% | 38% | 55% |
| Front luminance ratio (MoSi 5 nm) | 8% | 32% | 8% |

As shown in FIGS. 7 to 9, according to the present embodiment, it is clear that the semi-transparent metal layer 33 is provided; thereby, a decrease in luminance in an oblique direction can be suppressed compared to a case where the semi-transparent metal layer 33 is not provided. For example, when each of the light-emitting elements ESR, ESG, ESB is viewed in an oblique direction of 30° to 60° in a case where the semi-transparent metal layer 33 is not provided, the luminance is decreased to a level from about half to 10% with respect to the front luminance. Whereas, in a case where the semi-transparent metal layer 33 is provided, higher luminance by 5 to 50% compared to a case where the semi-transparent metal layer 33 is not provided can be obtained.

When viewed in an oblique direction, the colored light is the downward light (that is, the light directed toward the first electrode 22). The light passing through and the light reflected interfere with each other, and a difference in optical path length therebetween occurs when viewed in the oblique direction; therefore, interference fringes occur and coloring occurs. However, according to the present embodiment, the downward light is absorbed by the semi-transparent metal layer 33 and the interference effects by the external light are decreased; therefore, the occurrence of interference fringes can be suppressed. Consequently, as described above, the viewing angle characteristics can be improved, and the directivity can be reduced (the light can be emitted in all directions).

Note that as shown in FIGS. 7 to 9, the angular dependence is reduced as the thickness of the semi-transparent metal layer 33 increases. Therefore, the larger the thickness of the semi-transparent metal layer 33 to be inserted is, the better the visibility in the oblique direction is. However, as shown in Table 5 and Table 1, the larger the thickness of the semi-transparent metal layer 33 to be inserted is, the lower the front luminance ratio is. Therefore, in consideration of reduction in luminance, as described above, the layer thickness of the semi-transparent metal layer 33 is preferably in the range of 1 to 5 nm, is more preferably in the range of 2 nm or more and below 5 nm, and is particularly preferably 2 nm.

Second Embodiment

Differences from the first embodiment will be described in the present embodiment. Note that, for convenience of description, members having the same function as the members described in the first embodiment are designated by the same reference numbers, and descriptions thereof are omitted.

Figure 10:
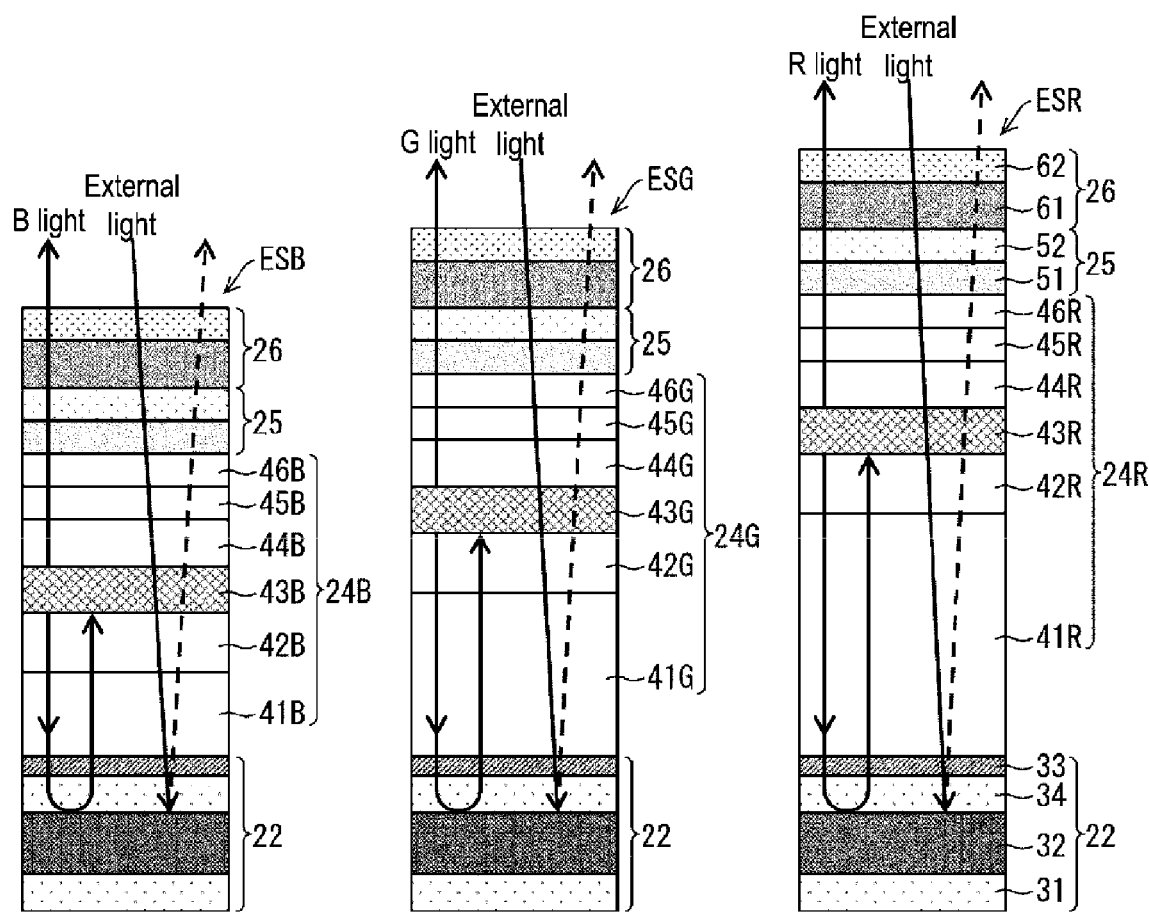
FIG. 10 is a cross-sectional view illustrating a schematic configuration of each of light-emitting elements in a light-emitting element layer of the display device according to a second embodiment.

FIG. 10 is a cross-sectional view illustrating a schematic configuration of each of the light-emitting elements ESR, ESG, ESB in the light-emitting element layer 5 of the display device 1 according to the present embodiment.

As illustrated in FIG. 10, the display device 1 according to the present embodiment is the same as the display device 1 according to the first embodiment, except in that the second transparent electrode 34 is disposed between the reflective metal layer 32 and the semi-transparent metal layer 33 in each of the light-emitting elements ESR, ESG, ESB.

In other words, in the display device 1 according to the present embodiment, the first electrode 22 in each light-emitting element ES includes the first transparent electrode 31, the reflective metal layer 32, the second transparent electrode 34, and the semi-transparent metal layer 33 from the lower layer side (that is, the thin film transistor layer 4 side).

The same effect as in the first embodiment can be obtained even in a case where the order of the second transparent electrode 34 and the semi-transparent metal layer 33 is reversed. In addition, as described above, the semi-transparent metal layer 33 such as MoSi has a large work function and allows for efficient hole injection into the function layer 24.

Modification Example 1

Further, in the first and second embodiments, a case in which the semi-transparent metal layer 33 of one layer is provided is described as an example, but the present embodiment is not limited thereto. The semi-transparent metal layer 33 of at least one layer is preferably provided between the reflective metal layer 32 and the function layer 24, and although not illustrated, the semi-transparent metal layer 33 may be provided between the reflective metal layer 32 and the second transparent electrode 34 as illustrated in FIG. 1 and between the second transparent electrode 34 and the function layer 24 as illustrated in FIG. 10. In other words, the semi-transparent metal layer 33 may include a first semi-transparent metal layer and a second semi-transparent metal layer, and the first electrode 22 of each light-emitting element ES may include the first transparent electrode 31, the reflective metal layer 32, the first semi-transparent metal layer, the second transparent electrode 34, and the second semi-transparent metal layer in this order from the lower layer side (that is, the thin film transistor layer 4 side).

Modification Example 2

Furthermore, in the first and second embodiments, a case in which the thickness of the semi-transparent metal layer 33 is constant in each of the light-emitting elements ESR, ESG, ESB is described as an example; however, the thickness of the semi-transparent metal layer 33 may be changed in each of the light-emitting elements ESR, ESG, ESB.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
   a thin film transistor layer including thin-film transistors;
   a light-emitting element layer including a plurality of light-emitting elements in each of which a first electrode, a function layer including a light-emitting layer, and a second electrode are disposed on the thin film transistor layer in this order from a side of the thin film transistor layer; and
   a sealing layer covering the light-emitting element layer,
   wherein the first electrode includes a first transparent electrode, a reflective metal layer, and a molybdenum silicide layer disposed, in this order, on the thin film transistor layer,
   the first electrode further includes a second transparent electrode disposed on the molybdenum silicide layer, and
   a layer thickness of the molybdenum silicide layer is in a range of 1 to 5 nm.

2. A display device comprising:
   a thin film transistor layer including thin-film transistors;
   a light-emitting element layer including a plurality of light-emitting elements in each of which a first electrode, a function layer including a light-emitting layer, and a second electrode are disposed on the thin film transistor layer in this order from a side of the thin film transistor layer; and
   a sealing layer covering the light-emitting element layer,
   wherein the first electrode includes a first transparent electrode, a reflective metal layer, and a layer formed by at least one of tungsten silicide, tungsten oxide, and nickel oxide, and disposed, in this order, on the thin film transistor layer, and
   the first electrode further includes a second transparent electrode disposed on the layer, or between the reflective metal layer and the layer.

3. The display device according to claim 1,
wherein a refractive index of the molybdenum silicide layer is larger than a refractive index of the second transparent electrode.

4. The display device according to claim 1,
wherein an absorption coefficient of the molybdenum silicide layer is larger than an absorption coefficient of the second transparent electrode.

5. The display device according to claim 1,
wherein the layer thickness of the molybdenum silicide layer is 2 nm.

6. The display device according to claim 2,
wherein a layer thickness of the layer is 2 nm.

7. The display device according to claim 1,
wherein an absorption coefficient of the molybdenum silicide layer is in a range of 0.1 to 10.

8. The display device according to claim 1,
wherein a refractive index of the molybdenum silicide layer is in a range of 2 to 7.

9. The display device according to claim 2,
wherein a refractive index of the layer is larger than a refractive index of the second transparent electrode.

10. The display device according to claim 2,
wherein an absorption coefficient of the layer is larger than an absorption coefficient of the second transparent electrode.

11. The display device according to claim 2,
wherein an absorption coefficient of the layer is in a range of 0.1 to 10.

12. The display device according to claim 2,
wherein a refractive index of the layer is in a range of 2 to 7.

13. A display device comprising:
a thin film transistor layer including thin-film transistors;
a light-emitting element layer including a plurality of light-emitting elements in each of which a first electrode, a function layer including a light-emitting layer, and a second electrode are disposed on the thin film transistor layer in this order from a side of the thin film transistor layer; and
a sealing layer covering the light-emitting element layer,
wherein the first electrode includes a first transparent electrode, a reflective metal layer, and a molybdenum silicide layer disposed, in this order, on the thin film transistor layer,
the first electrode further includes a second transparent electrode disposed between the reflective metal layer and the molybdenum silicide layer, and
a layer thickness of the molybdenum silicide layer is in a range of 1 to 5 nm.

14. The display device according to claim 13,
wherein a refractive index of the molybdenum silicide layer is larger than a refractive index of the second transparent electrode.

15. The display device according to claim 13,
wherein an absorption coefficient of the molybdenum silicide layer is larger than an absorption coefficient of the second transparent electrode.

16. The display device according to claim 13,
wherein the layer thickness of the molybdenum silicide layer is 2 nm.

17. The display device according to claim 13,
wherein an absorption coefficient of the molybdenum silicide layer is in a range of 0.1 to 10.

18. The display device according to claim 13,
wherein a refractive index of the molybdenum silicide layer is in a range of 2 to 7.

19. The display device according to claim 2,
wherein the second transparent electrode is disposed on the layer.

20. The display device according to claim 19,
wherein a layer thickness of the layer is 2 nm.

* * * * *